United States Patent
Moctezuma

(10) Patent No.: US 11,971,735 B2
(45) Date of Patent: Apr. 30, 2024

(54) LOW AREA FREQUENCY COMPENSATION CIRCUIT AND METHOD

(71) Applicant: TEXAS INSTRUMENTS INCORPORATED, Dallas, TX (US)

(72) Inventor: Ariel Dario Moctezuma, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/083,512

(22) Filed: Oct. 29, 2020

(65) Prior Publication Data

US 2021/0149427 A1 May 20, 2021

Related U.S. Application Data

(60) Provisional application No. 62/929,531, filed on Nov. 1, 2019.

(51) Int. Cl.
G05F 1/575 (2006.01)
H03F 1/08 (2006.01)
H03K 5/00 (2006.01)

(52) U.S. Cl.
CPC ............ G05F 1/575 (2013.01); H03F 1/086 (2013.01); H03K 5/00006 (2013.01)

(58) Field of Classification Search
CPC ... H03H 11/483; H03H 11/481; H03H 11/405
See application file for complete search history.

(56) References Cited

U.S. PATENT DOCUMENTS

| | | | | | |
|---|---|---|---|---|---|
| 4,686,487 | A | * | 8/1987 | Radovsky | H03F 3/345 330/288 |
| 5,182,526 | A | * | 1/1993 | Nelson | H03F 1/083 323/280 |
| 5,410,242 | A | * | 4/1995 | Bittner | G05F 3/16 323/315 |
| 5,650,746 | A | * | 7/1997 | Soltau | H03H 11/405 327/563 |
| 5,721,484 | A | * | 2/1998 | Ngo | G05F 3/265 327/532 |
| 5,874,858 | A | * | 2/1999 | Furuya | H03F 3/50 330/273 |
| 5,900,771 | A | * | 5/1999 | Bremner | H03K 5/13 327/540 |
| 5,986,507 | A | * | 11/1999 | Itakura | G05F 3/262 330/288 |

(Continued)

*Primary Examiner* — Thomas J. Hiltunen

(74) *Attorney, Agent, or Firm* — John R. Pessetto; Frank D. Cimino

(57) ABSTRACT

A compensation circuit comprising: a first source having an output; a second source having an output; a first transistor having a first current terminal coupled to the output of the first source, a second current terminal coupled to ground and a first control terminal connected to the first current terminal; a second transistor having a second control terminal, a third current terminal coupled to the output of the second source and a fourth current terminal coupled to ground; a first resistor connected between the first control terminal and the second control terminal; and a capacitor having a first terminal and a second terminal, the first terminal of the capacitor connected to the second control terminal.

8 Claims, 9 Drawing Sheets

(56) References Cited

U.S. PATENT DOCUMENTS

| | | | | |
|---|---|---|---|---|
| 6,664,848 B1* | 12/2003 | Gist | G05F 1/46 | |
| | | | 327/551 | |
| 6,778,004 B1* | 8/2004 | Jackson | G05F 3/262 | |
| | | | 327/538 | |
| 6,778,016 B2* | 8/2004 | Luo | H03F 3/3432 | |
| 6,847,260 B2* | 1/2005 | Gupta | H03F 1/086 | |
| | | | 330/257 | |
| 7,009,452 B2* | 3/2006 | Grilo | H03F 3/45475 | |
| | | | 330/288 | |
| 7,423,474 B2* | 9/2008 | Behzad | H04B 1/30 | |
| | | | 327/558 | |
| 7,667,272 B2* | 2/2010 | Hirose | G05F 3/262 | |
| | | | 438/238 | |
| 7,733,165 B2* | 6/2010 | Brenner | H04B 15/005 | |
| | | | 327/551 | |
| 7,880,545 B1* | 2/2011 | Venca | H03F 3/45475 | |
| | | | 330/253 | |
| 8,193,859 B1* | 6/2012 | Hietala | H03G 3/3042 | |
| | | | 330/140 | |
| 8,330,529 B1* | 12/2012 | Zhang | G05F 1/575 | |
| | | | 324/416 | |
| 8,362,822 B2* | 1/2013 | Imayama | H03F 1/301 | |
| | | | 327/543 | |
| 8,487,692 B1* | 7/2013 | Chen | H03K 17/164 | |
| | | | 327/538 | |
| 8,564,256 B2* | 10/2013 | May | G05F 1/618 | |
| | | | 323/224 | |
| 9,166,530 B2* | 10/2015 | Ding | H03F 3/193 | |
| 9,195,248 B2* | 11/2015 | Zegheru | G05F 1/468 | |
| 9,214,929 B2* | 12/2015 | Wang | H03K 5/08 | |
| 9,438,133 B2* | 9/2016 | Wang | H02M 7/06 | |
| 9,729,114 B2* | 8/2017 | Astgimath | H03F 3/187 | |
| 10,423,177 B2* | 9/2019 | Fiocchi | G05F 1/465 | |
| 10,425,071 B2* | 9/2019 | Karmaker | H03K 5/153 | |
| 10,911,026 B2* | 2/2021 | Cheng | H03H 11/126 | |
| 11,196,387 B2* | 12/2021 | Wen | H03F 3/301 | |
| 2004/0164790 A1* | 8/2004 | Moon | G05F 3/262 | |
| | | | 327/546 | |
| 2008/0157865 A1* | 7/2008 | Smith | H03L 7/093 | |
| | | | 327/524 | |
| 2018/0173259 A1* | 6/2018 | Mæland | G05F 1/575 | |

* cited by examiner

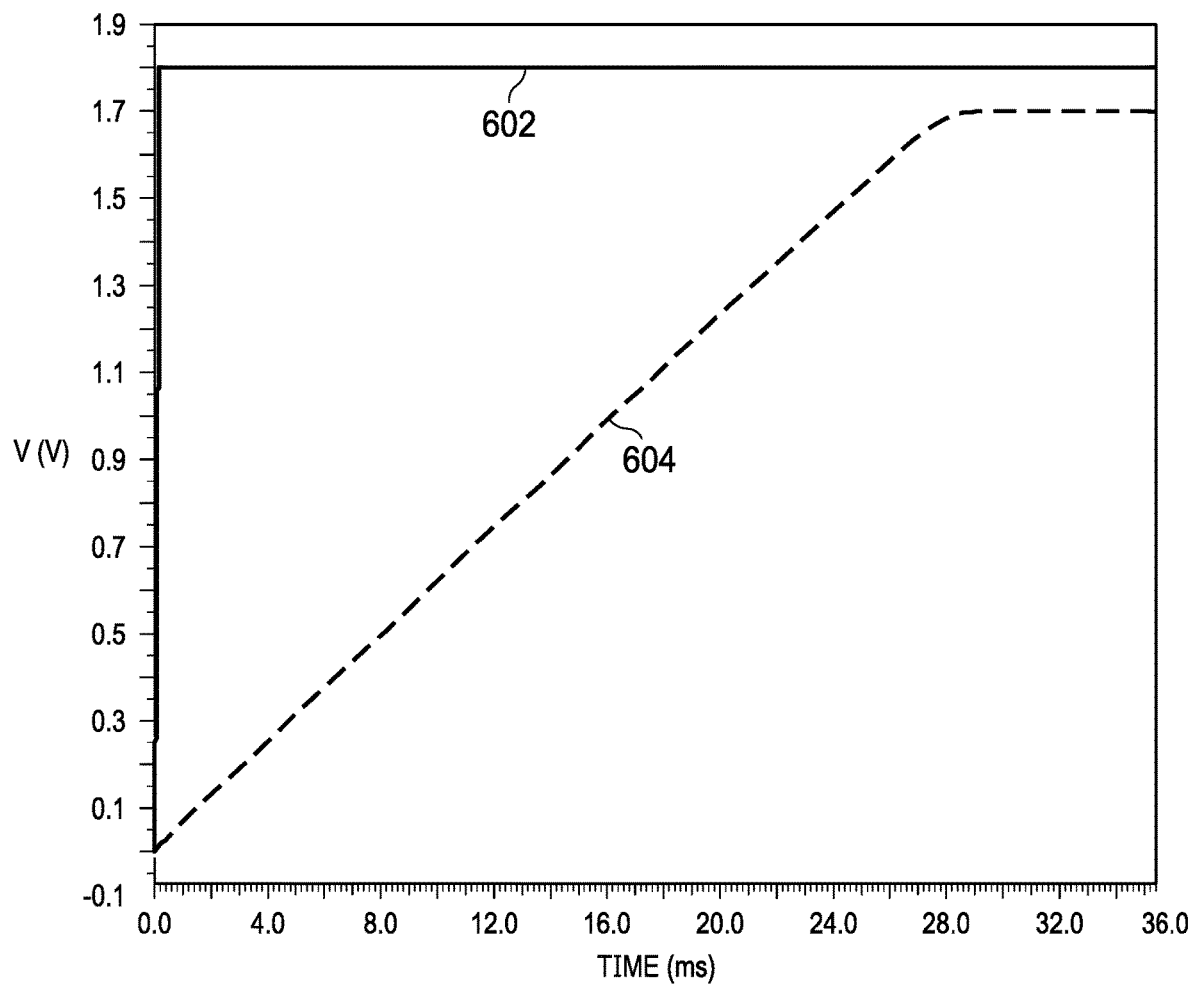

LOW AREA FREQUENCY COMPENSATION CIRCUIT AND METHOD

CROSS-REFERENCE TO RELATED APPLICATIONS

The application claims priority to U.S. Provisional Application No. 62/929,531, filed Nov. 1, 2019 entitled "Low Area Frequency Compensation on Single Node", which is hereby incorporated herein by reference in its entirety.

BACKGROUND

Electronic devices, such as personal electronic devices, robots, electric cars, industrial equipment, medical equipment and wearable devices, require a stable circuitry. For devices that are powered by batteries, longer battery life is desirable so high efficiency circuitry is important. In order to achieve stability, positive feedback (where the output of feedback loop is added to the input of the feedback loop) or negative feedback (where the output of feedback loop is subtracted from the input of the feedback loop) is often used. For example, operational amplifiers ("OP Amps") may incorporate negative feedback (where the inverting input is coupled to the output of the OP Amp) or positive feedback (where non-inverting input is coupled to the output of the OP Amp). FIG. 1 illustrates a simple feedback system 100 where the gain of block 102 is "A" and the gain of block 104 is "B". The output voltage, $V_{OUT}$, for the system is:

$$V_{OUT}=(V_{IN}*A)/(1+AB) \quad (1)$$

As is apparent from equation (1), the product of A and B should not be approach −1 otherwise $V_{OUT}$ will approach infinity. Hence, feedback system 100 will become unstable if the phase of the feedback signal changes phase by more than 180 degrees and the gain is greater than one.

For non-ideal circuits, gain and phase vary based on the frequency of the signal that passes through the circuit. In light of this, feedback circuit 100 is said to have a "pole" for frequencies where the product of A and B is −1. If a "pole" occurs at a frequency in which the circuit is intended to operate, a compensation technique may be used to move the "pole" to another frequency. The compensation techniques may require circuit components that are difficult to integrate into the circuitry and may create additional poles (and zeros). One such technique is referred to as Miller Compensation, which uses a capacitor in parallel with block 102. However, in order to effectively move the "pole", a capacitor with a large capacitance (and, hence, a large size) may be required. This type of capacitor may not be easily implemented on a semiconductor chip or in a semiconductor package.

SUMMARY

A compensation circuit comprising: a first source having an output; a second source having an output; a first transistor having a first current terminal coupled to the output of the first source, a second current terminal coupled to ground and a first control terminal connected to the first current terminal; a second transistor having a second control terminal, a third current terminal coupled to the output of the second source and a fourth current terminal coupled to ground; a first resistor connected between the first control terminal and the second control terminal; and a capacitor having a first terminal and a second terminal, the first terminal of the capacitor connected to the second control terminal. In some example embodiments, the compensation circuit is operable to be coupled to a feedback circuit to change a pole of the feedback circuit. In some example embodiments, the first source is comprised of a first voltage source and a first current source connected in series, and the second source is comprised of a second voltage source and a second current source connected in series. The compensation may further include a third transistor having a third control terminal, a fifth current terminal connected to the first control terminal and a sixth current terminal connected to the second control terminal. The compensation circuit may include: a fourth transistor situated between the first source and the first current terminal, the fourth transistor having a fourth control terminal, a seventh current terminal connected to the fourth control terminal and the output of the first source and an eighth current terminal coupled to the first current terminal; and a fifth transistor having a fifth control terminal connected to the fourth control terminal, a ninth current terminal and a tenth current terminal connected to third current terminal. In such embodiment, the compensation circuit may also include: a second resistor connected between the second current terminal and ground; and a third resistor connected between the fourth current terminal and ground. In some example embodiments, the second terminal of the capacitor is connected to the output of the second source, but in others the second terminal of the capacitor is connected to an input of the compensation circuit. The first transistor, the second transistor, the fourth transistor and/or the fifth transistor may be n-type MOSFETs.

Another example embodiment is a compensation circuit comprising: a first voltage source; a first transistor having a first current terminal coupled to the first voltage source, a second current terminal and a first control terminal; a second transistor having a second control terminal, a third current terminal coupled to the first voltage source and a fourth current terminal connected to the second control terminal; a first resistor connected between the first control terminal and the second control terminal; a capacitor connected between the first control terminal and the second current terminal; a first current source connected between the second current terminal and ground; and a second current source connected between the fourth current terminal and ground. The compensation circuit may be operable to be coupled to a feedback circuit to change a pole of the feedback circuit. Alternatively, the compensation circuit further includes a third transistor having a third control terminal, a fifth current terminal connected to the first control terminal and a sixth current terminal connected to the second control terminal. In some example embodiments, the first transistor and the second transistor are p-type MOSFETs, and the third transistor is an n-type MOSFET.

Another embodiment is a regulator having an input, an output and a pole at a first frequency, the regulator comprising: a first transistor having a first control terminal, a first current terminal connected to a band gap voltage and a second current terminal; a second transistor having a second control terminal coupled to the second current terminal, a third current terminal coupled to the input of the regulator and a fourth current terminal coupled to the output of the regulator; a soft start circuit; and a compensation circuit. The soft start circuit includes: a capacitor having a first terminal coupled to the first control terminal and a second terminal coupled to ground; and a switch coupled between the first terminal of the capacitor and a first source. The compensation circuit includes: a first voltage source; a third transistor having a fifth current terminal coupled to the first voltage source, a sixth current terminal coupled to first terminal of the capacitor and a third control terminal; a fourth transistor having a fourth control terminal, a seventh current terminal coupled to the first voltage source and a eighth current terminal connected to the fourth control terminal; a first resistor connected between the third control terminal and the fourth control terminal; a capacitor connected between the third control terminal and the sixth current terminal; a first current source connected between the sixth current terminal and ground; and a second current source connected between the eighth current terminal and ground. The first frequency is shifted to a second frequency by the presence of the compensation circuit.

BRIEF DESCRIPTION OF THE DRAWINGS

For a detailed description of various examples, reference will now be made to the accompanying drawings in which:

FIG. 6 is a graph of voltage versus time for the soft start circuit of FIGS. 5A and 5B.

DETAILED DESCRIPTION

An example embodiment includes a compensation circuit for moving the pole(s) of a circuit (which may include feedback) from one frequency to another frequency. Without the addition of the compensation circuit of some example embodiments, a circuit may have a pole at a frequency in the operating frequency band of the circuit. With the addition of the compensation circuit of the example embodiment, the original pole of the circuit may be replaced with: a lower frequency pole (e.g. around 100 Hz or less), a higher frequency pole (e.g. higher than 1 MHz) and a zero. In addition, the compensation circuit of the example embodiments may incorporate components (such as capacitors, resistors and transistors) that are smaller and can be implemented using standard semiconductor processing or packaged within a semiconductor device package.

Figure 1:
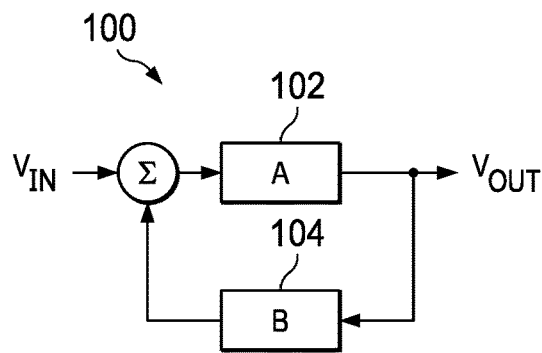
FIG. 1 is a block diagram of a traditional feedback system.
Figure 2A:
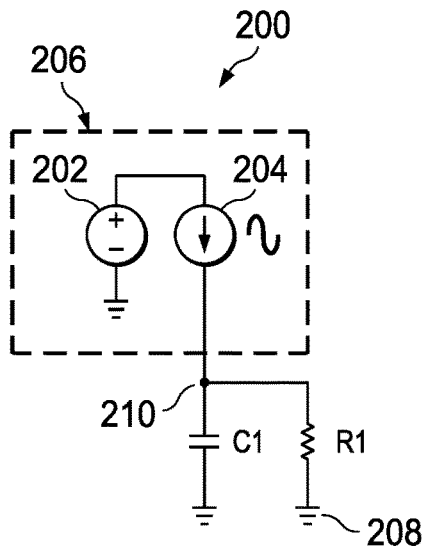
FIG. 2A is a schematic diagram of a single pole system of an example embodiment.
Figure 4:
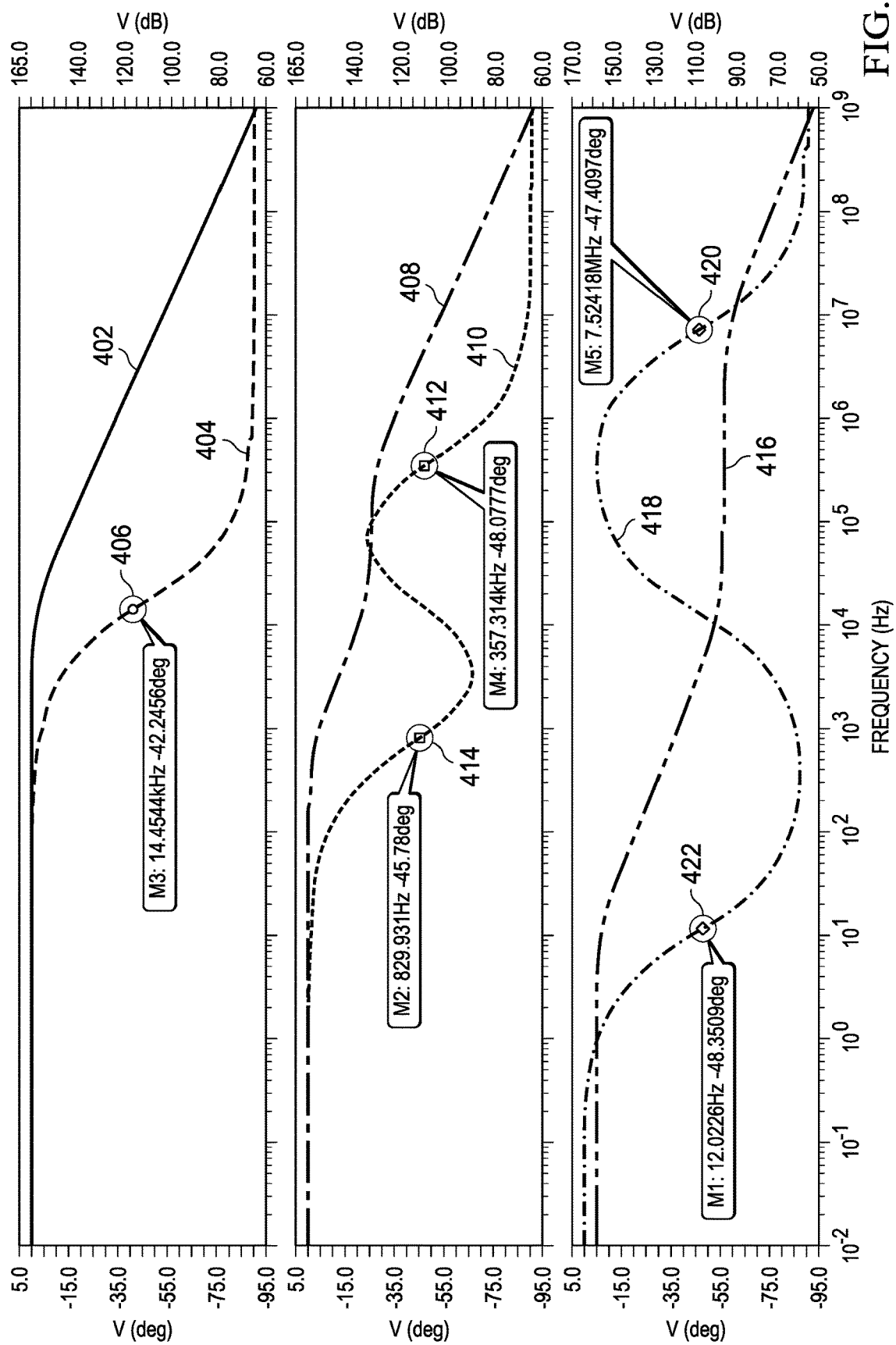
FIG. 4 is a bode plot illustrating example embodiments for the compensation circuits of FIGS. 2A, 2B and 3.

Referring to FIG. 2A, circuitry 200 illustrates feedback circuitry without a compensation circuit. The circuitry 200 includes capacitor C1 and resistor R1 connected in parallel between circuitry 206 and ground 208. Circuitry 206 can include any type of control circuitry, power circuitry or amplification circuitry and is modeled by a direct current (DC) voltage supply 202 and current source 204 that includes one or more frequency components. Current source 204 may supply a current at a single frequency that may or may not be a constant frequency or it may supply multiple currents with each having a different frequency (that may or may not vary). Referring to FIG. 4, graph 402 illustrates the voltage gain/attenuation (in dB) of circuitry 200 at node 210 when current source 204 supplies a one-amp alternating current (AC) with C1=100 fF and R1=100 MΩ. Graph 404 illustrates the phase of the voltage at node 210 where current source 204 supplies a one-amp AC current, C1=100 fF and R1=100 MΩ. Point 406 on graph 404 illustrates that a pole occurs at around 14.45 kHz and −42.245 degrees.

Figure 2B:
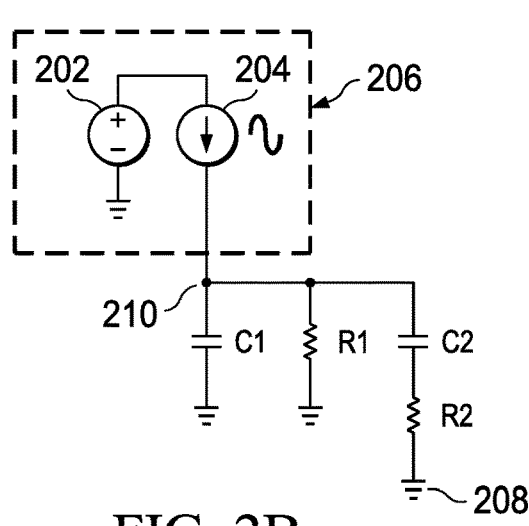
FIG. 2B is a schematic diagram of a pole-zero compensation circuit of an example embodiment.

Referring to FIG. 2B, a compensation circuit including capacitor C2 connected in series with resistor R2 is added to circuitry 200 to create circuitry 300. The series-coupled C2/R2 combination is connected between circuitry 206 and ground 208. As discussed above, the addition of the compensation circuitry (R2/C2) causes an additional pole and zero but shifts the location of the poles to a lower frequency and a higher frequency as compared to the pole 406 of circuitry 200. Referring to FIG. 4, graph 408 illustrates the voltage gain/attenuation (in dB) at node 210 and graph 410 illustrates the phase (in degrees) of the voltage at node 210 where current source supplies a one-amp AC current, C1=100 fF, C2=2 pF, R1=100 MΩ and R2=5 MΩ. As discussed prior, the addition of the R2/C2 compensation circuit creates poles 412 and 414 but takes away pole 406. More specifically, instead of having a pole at around 14 MHz (pole 406) the addition of the R2/C2 compensation creates poles at around 830 Hz (pole 414) and 357 kHz (pole 412). Additionally, a zero (not shown) is created around 15 kHz.

Figure 3:
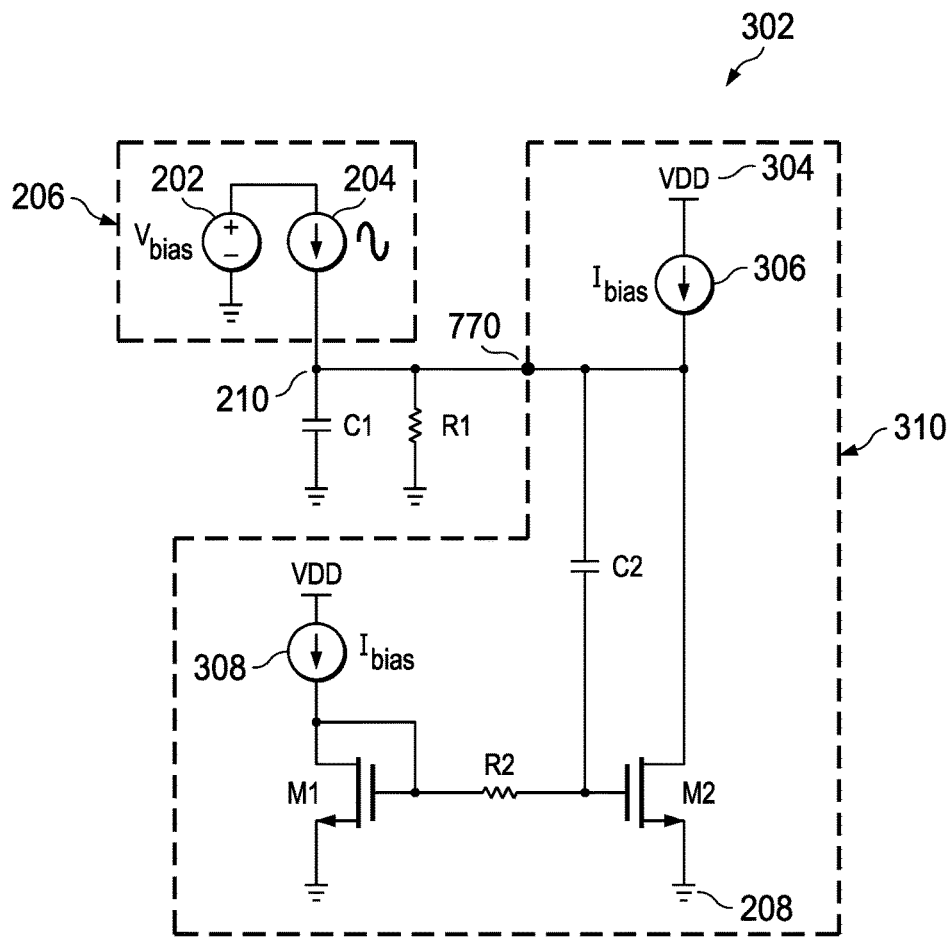
FIG. 3 is a schematic diagram of a compensation circuit of an example embodiment.

When compensation circuit 300 is incorporated in a circuit as part of a feedback loop, the shifting of the poles and the addition of the zero allow for certain circuits to be frequency compensated to prevent instability. One such example is when another pole in the system is located at around 15 kHz. In this case, the zero cancels out the pole and the loop gain would drop to unity before the phase margin becomes too small or negative. However, a large capacitor (C2=2 pF) is needed for compensation circuit 300 to effectively shift the existing pole. Implementation of a larger capacitor may be difficult in some circuit designs. Referring to FIG. 3, circuit 302 implements compensation circuit 310 coupled to circuitry 206, C1 and R1. Compensation circuit 310 includes voltage sources 304 ($V_{DD}$), current sources 306 and 308 ($I_{BIAS}$) and transistors M1 and M2 in addition to capacitors C1 and C2 and resistors R1 and R2. Similar to circuits 200 and 300, capacitor C1 and resistor R1 are connected in parallel from node 210 to ground 208 and represent the output impedance of a feedback circuit (such as an amplifier). In some example embodiments, transistors M1 and M2 may have the same width/length ratio and may be connected similar to a current mirror with resistor R2 placed between the gates of M1 and M2. However, in other example embodiments, M1 and M2 have different width/length ratios. If transistors M1 and M2 are n-type metal-oxide silicon field effect transistors (nMOSFETs), the sources of M1 and M2 are coupled to ground and the drains are connected to current sources 308 and 306, respectively. Additionally, the gate of transistor M1 is connected to the drain of transistor M1. While FIG. 3 shows M1 and M2 as nMOSFETs, other types of transistors (such as pMOSFETs or a combination of pMOSFETs, nMOSFETs and/or bi-polar junction transistors (BJT)) may be used with modification to the compensation circuit. In some example embodiments, compensation circuit 501 (FIG. 5B) may be used instead of compensation circuit 310.

For the circuitry of FIG. 3, the voltage at node 210 would change slowly if a positive current pulse is provided by circuitry 206. However, the voltage at node 210 would change faster if a negative current pulse is provided by circuitry 206. Hence, this can be used to create a one-sided transient response. For example, a protection circuit where node 210 drives an nMOSFET may be turned off rapidly. In contrast, a pMOSFET-based architecture would rapidly respond to a positive current pulse. A dual-type nMOSFET/pMOSFET architecture can be used if a slower response is desired.

Capacitor C2 is connected between node 210 and the gate of transistor M2. In some example embodiments, a smaller (e.g. 50 to 100 times smaller) capacitor C2 can be used in circuit 302 (compared to the capacitor C2 used in circuit 300) to create the lower frequency pole and moving the second pole to a substantially higher frequency (e.g. 20 times higher). In other words, the inclusion of transistors M1 and M2 along with the placement of R2 between the two, makes the capacitance of C2 appear larger. At low frequencies, M2 diverts some of the AC current from C2 (hence, the current through M2 becomes larger and the current through C2 becomes smaller), thereby making C2 appear larger and pulling the first pole (pole 414) to a lower frequency (pole 422). At high frequencies, the impedance of C2 reduces (making C2 look like a short) thereby creating a low impedance (or, in some example embodiments, a short) path between the gate and the drain of M2. Hence, in such example embodiments, M2 becomes a diode-connected MOSFET at high frequencies. This results in the pushing of the second pole (pole 412) to a higher frequency (pole 420). In some example embodiments, the zero created by the combination of R2 and C2 can be used to cancel another pole in the system.

For the example embodiments where C2 is much larger than C1 and R1 is much larger than R2, circuitry 200 will have a pole at:

$$\frac{1}{2\pi R_1 C_1} \tag{2}$$

Applying the same conditions, circuitry 300 will have two poles. One at approximately:

$$\frac{1}{2\pi R_1 C_1} \tag{3}$$

and the other at approximately:

$$\frac{1}{2\pi R_2 C_1} \tag{4}$$

In addition, circuitry 300 will have a zero at:

$$\frac{1}{2\pi R_2 C_2} \tag{5}$$

Using the same conditions, circuitry 302 will have poles at approximately (6) and (7) and a zero at (8).

$$\frac{1}{2\pi R_1 C_2} \frac{1}{g_{m,M2} R_2} \tag{6}$$

$$\frac{g_{m,M2}}{2\pi (C_1 + C_{gs,M2})} \tag{7}$$

$$\frac{1}{2\pi R_2 C_2} \tag{8}$$

where $g_{m,M2}$ is the transconductance of transistor M2, and $C_{gs,M2}$ is the gate to source capacitance of transistor M2. In another example embodiment, a cascode may be added to increase the output resistance of M2.

Referring to FIG. 4, graph 416 illustrates the voltage gain/attenuation (in dB) at node 210 for circuitry 302 when a 1 Amp AC current is supplied to the impedance at node 210, and graph 418 illustrates the phase (in degrees) of the voltage at node 210 for circuitry 302 where the current source 204 supplies a 1 µA AC current, C1=100 fF, C2=2 pF, R1=100 MΩ and R2=5 MΩ. As discussed prior, the addition of the R2/C2 compensation circuit in circuit 300 creates poles 412 and 414 but takes away pole 406. With the addition of compensation circuit 310, the poles are moved even more (with respect to frequency). Specifically, pole 414 moved from around 830 Hz to around 12 Hz (pole 422) and pole 412 moved from around 357 kHz to around 7.5 MHz (pole 420).

Figure 5A:
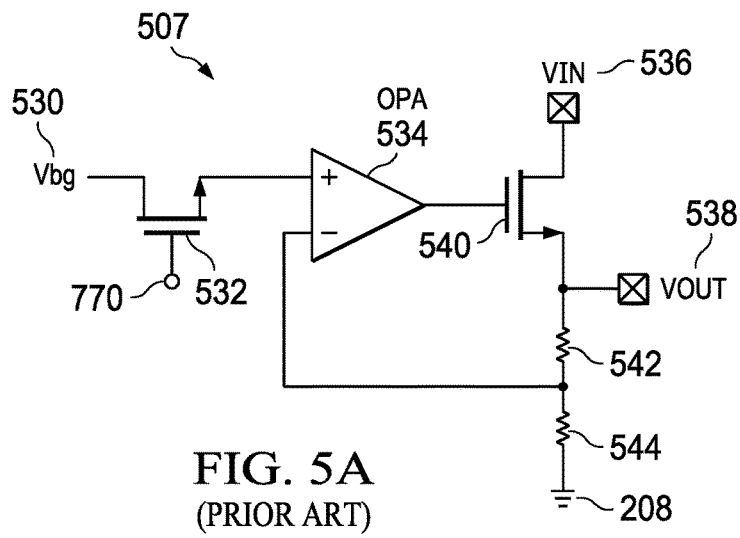
FIG. 5A is a schematic diagram of a traditional low dropout voltage regulator.
Figure 5B:
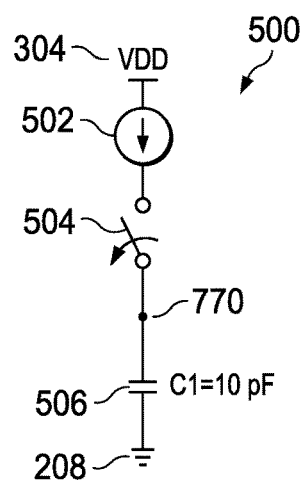
FIG. 5B is a schematic diagram of a traditional soft start circuit.

FIG. 5A illustrates a traditional low dropout voltage regulator (LDO). FIGS. 5B (traditional) and 5C (example embodiment) illustrate soft start circuits. Generally, soft start circuits are used to limit in-rush currents to a device that is being powered through the regulator. For a voltage regulator, a soft start circuit is used to slowly ramp the output of the regulator so that the device that is powered by the regulator is not damaged.

Referring to FIG. 5A, LDO 507 regulates the voltage applied at input voltage $V_{IN}$ 536 by use of band gap voltage 530 ($V_{BG}$) to get the output voltage $V_{OUT}$ 538. Transistor 532 is connected between band gap voltage 530 and the non-inverting input of OPA 534. The gate of transistor 532 is connected to node 770. The output of OPA 534 is connected to the gate of transistor 540. The drain of transistor 540 is connected to input voltage 536 and the source of transistor 540 is connected to the output voltage 538 and to ground through a resistive divider formed by resistors 542 and 544.

Referring to FIG. 5B, the traditional soft start circuit 500 includes a switch 504 and a capacitor 506 connected between the switch and ground. Soft start circuit 500 is connected (at node 770) to the gate of transistor 532 of voltage regulator 507. During soft start operation, the voltage at node 770 ramps thereby turning on pass transistor 532 to ramp the band gap voltage to the non-inverting input of OPA 534. As a consequence, the output of op amp 534 will rise thereby turning on transistor 540 and ramping the output voltage 538. Traditional soft start circuitry 500 may be completely integrated onto a single semiconductor die. As such, it is difficult to fabricate a capacitor with a large capacitance value, because that would require too much area on/over the semiconductor die. However, in order to effectively create a slow ramping of the output of the regulator, capacitor 506 needs to be as large as possible. Referring to FIG. 6, plot 602 illustrates the voltage at node 770 of FIG.

5B where switch 506 is closed at t=0.0 mS (time is zero). Since capacitor 506 is only 10 pF, the voltage ramp 602 for soft start circuit 500 is not very gradual.

Figure 5C:
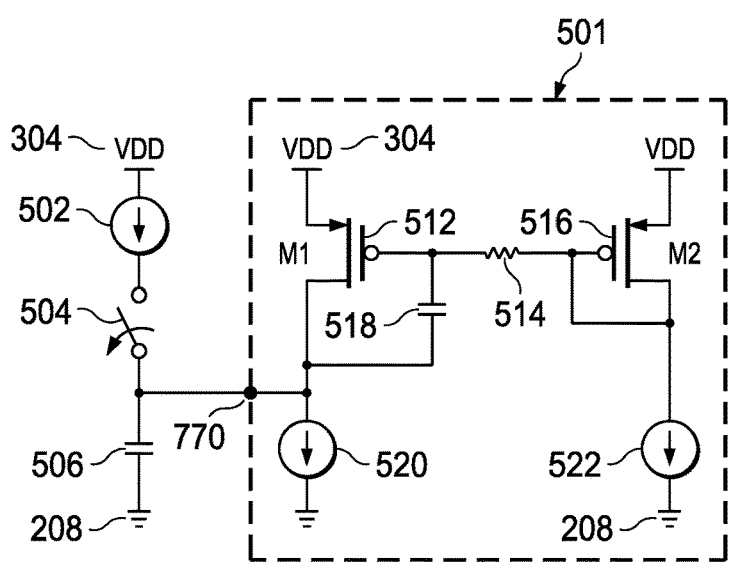
FIG. 5C is a schematic diagram of a soft start circuit of an example embodiment.

The soft start circuit of FIG. 5C uses the same components as soft start circuit 500, but the compensation circuit 501 of some example embodiments is added at node 770. Compensation circuit 501 includes pMOSFETs 512 (M1) and 516 (M2). Resistor 514 (R2) is connected between the gates of transistors 512 and 516. The sources of transistors 512 and 516 are connected to voltage supplies 304 ($V_{DD}$), and the drains are connected to ground 208 via current sources 520 and 522, respectively. Capacitor 518 (C2) is connected between the gate of transistor 512 to the drain of transistor 512, and the drain of transistor 512 is also connected to node 770. The gate of transistor 516 is connected to the drain of transistor 516. Generally, transistors 512 and 516 form a current mirror with the addition of resistor 514 and capacitor 518. While FIG. 5B utilizes compensation circuit 501, compensation circuit 310 may be used instead of compensation circuit 501 in some example embodiments.

Referring to FIG. 5C, in operation, switch 504 is closed at t=0 to start the soft start operation. Since the output (node 538) of regulator 507 is connected to a load (e.g. a battery to be charged, a consumer electronics device, industrial equipment, a battery operated device, computer, laptop, display or an automotive device) that may be damaged by a sudden rise of voltage at t=0, the voltage ramp at output node 538 should be gradual. To achieve a gradual voltage increase at output voltage node 538, pass transistor 532 is slowly turned on based on the gradual increase of voltage at the gate of pass transistor 532. As discussed above, the gradual turning on of pass transistor 532 creates a gradual voltage increase at the non-inverting node of OPA 534, which causes a gradual turning on of transistor 540. As is shown by plot 604 of FIG. 6 (illustrating the voltage (in volts) at node 770 versus time (in milliseconds) for the circuitry of FIG. 5C), the voltage ramp with the addition of compensation circuit 501 is more gradual than the voltage ramp (plot 602) for a traditional soft start circuit 500 (FIG. 5B). Generally, the addition of compensation circuit 501 at node 770 adds a much larger capacitor in parallel to capacitor 506. This additional capacitance causes the voltage ramp to increase more slowly for the circuitry of FIG. 5C. As stated above, in some example embodiments, compensation circuit 501 is replaced with compensation circuit 310 at node 770 with similar results as those depicted in plot 604.

Figure 7A:
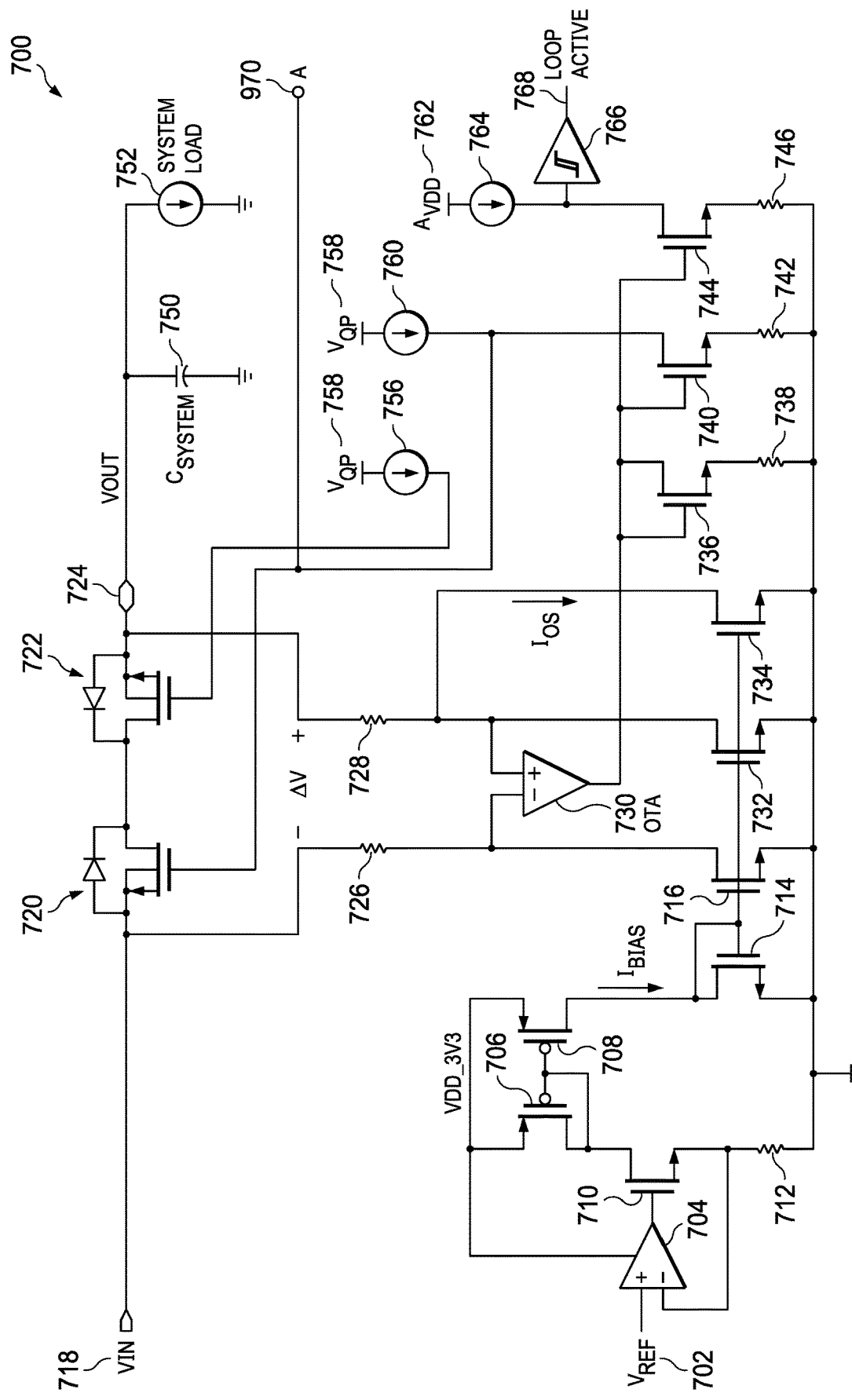
FIGS. 7A and 7B are a schematic diagram illustrating a reverse current protection system of an example embodiment.
Figure 7B:
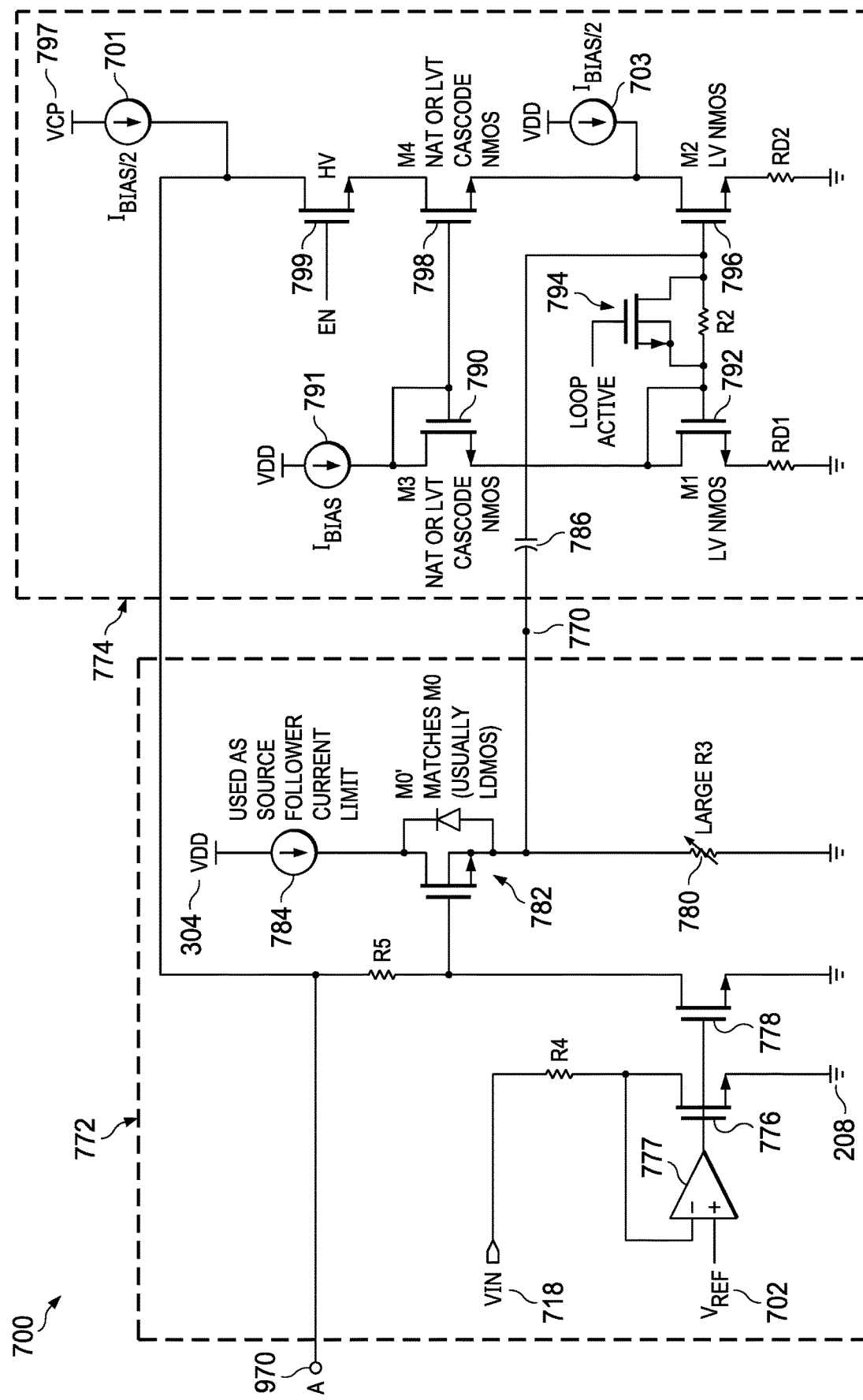

Power supply products (e.g. load switches and regulators) are used to provide power to one or more loads. Reverse current protection circuits can be used in power supply products to prevent damage to the power supply products (or other circuitry or batteries connected thereto) from currents flowing from the load to the power supply product. FIGS. 7A and 7B illustrate a reverse current protection circuit of an example embodiment. Load switch circuit 700 includes the circuitry of FIG. 7A and FIG. 7B (comprised of level shifter 772 and compensation circuit 774.

Referring to FIG. 7A, load switch circuit 700 includes reverse current protection circuitry. Load switch 700 connects an input voltage 718, $V_{IN}$, to an output voltage 724, $V_{OUT}$, through pass transistor 720 (including a body diode) and block transistor 722 (including a body diode). In some example embodiments, pass transistor 720 may be a low voltage or high-voltage sense FET (e.g. a laterally-diffused metal-oxide semiconductor field effect transistor—LDMOS) and blocking transistor 722 can be a high-voltage or a low-voltage FET or LDMOS. The source of transistor 720 is connected to input voltage 718 and the drain is connected to the drain of transistor 722. The source of transistor 722 is connected to load 752 (shown as a current source) via output node 724. Capacitor 750, $C_{SYSTEM}$, is connected between output node 724 and ground. The gates of transistors 720 and 722 are connected to voltage supply 758, $V_{QP}$, through current sources 756 and 760, respectively.

Amplifier 730 (e.g. an operational transconductance amplifier) has an inverting input connected through resistor 726 to input 718 and a non-inverting input coupled through resistor 728 to output 724 to measure the voltage (shown as ΔV) from input 718 to output 724. The output of amplifier 730 is connected to the gate and drain of diode-connected transistor 736 and to the gates of transistors 740 and 744. The sources of transistors 736, 740 and 744 are connected to ground through transistor resistors 738, 742 and 746, respectively. The drain of transistor 740 is connected to voltage supply 758 through current source 760, and the drain of transistor 744 is connected to voltage supply 762, $A_{VDD}$, through current source 764. Current source 764 is also connected to Schmitt trigger 766 (e.g. a hysteretic amplifier), that has an output (loop active) connected to node 768. The non-inverting input of amplifier 730 is connected to the drains of transistors 732 and 734 (which form a current mirror with transistors 714 and 716), and the inverting input of amplifier 730 is connected to the drain of transistor 716. The sources of transistors 714, 716, 732 and 734 are connected to ground, and the gates of these transistors are connected. Transistors 716 and 732 create an equal current-resistor drop across resistors 726 and 728, respectively, and transistor 734 creates an offset at the input of OTA 730 equal to current $I_{OS}$ times the resistance 728.

Reference voltage 702 is connected to the non-inverting input of amplifier 704, which has an upper supply connected to $V_{DD}$. The output of amplifier 704 is connected to the gate of transistor 710. The source of transistor 710 is connected to the inverting input of comparator 704 and to ground through resistor 712. A current mirror formed by transistors 706 and 708 is connected between $V_{DD}$ and the drain of transistor 710 on one end and to the current mirror formed with transistors 714, 716, 732 and 734. The current flowing into the drain of transistor 714 is $I_{BIAS}$ and the current flowing into the drain of transistor 734 is $I_{OS}$.

The circuit in FIG. 7A operates to prevent current from flowing from the output 724 to the input 718. This is achieved by modulating the resistance of transistor 720 such that there is a constant voltage drop from $V_{IN}$ to $V_{OUT}$. In some examples, this small voltage drop is only 5 mV in magnitude. In this case, the amplifier 730 causes $V_{OUT}$ to be equal to $V_{IN}$ minus 5 mV for positive system loads (which means that FET 720 will not be fully turned on at small positive loads). If the system load becomes negative (such as when current is flow from the load toward $V_{IN}$), the non-inverting input of amplifier 730 becomes greater than the inverting input of amplifier 730, and transistor 720 is turned off. The small 5 mV voltage offset is generated by resistors 726 and 728. The circuit comprised of amplifier 704, voltage reference 702, transistors 710 and 706 and resistor 712 form a constant current source equal to $V_{REF}$ divided by resistor 712. In an example where current mirror ratios of transistors 706 and 708 and transistors 714 and 734 are 1:1 and resistors 726 and 728 are of equal magnitude, a small voltage offset equal to $V_{REF}$ times the quotient of the resistance of resistor 728 divided by the resistance of resistor 712 is applied at resistor 728.

Figure 9:
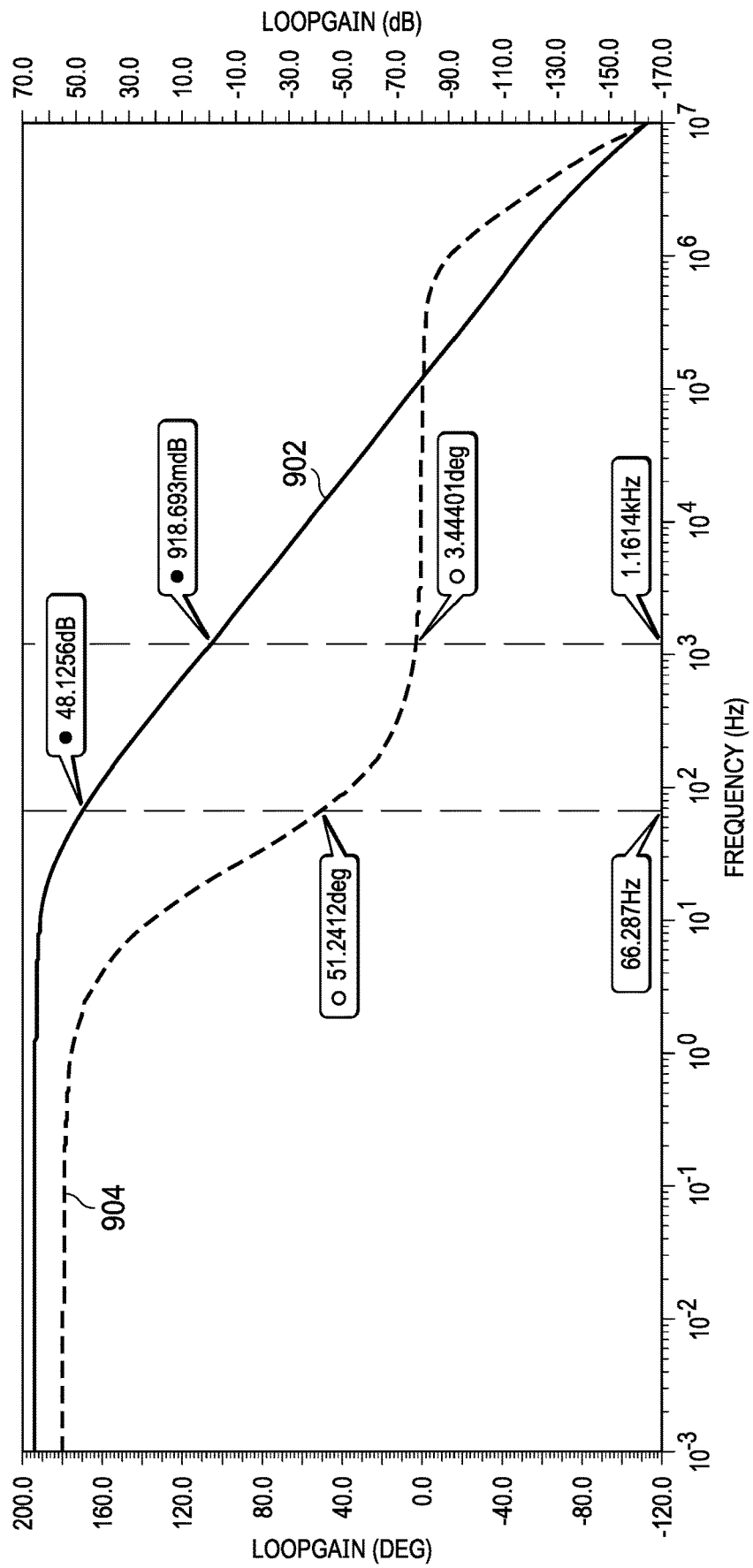
FIG. 9 is a bode plot illustrating an example embodiment of FIG. 7A.

Referring to FIG. 9, graph 902 illustrates the gain/attenuation (in dB) and graph 904 illustrates the loop phase for load switch circuit 700 of FIG. 7A (but not including level shifter 772 and compensation circuit 774 of FIG. 7B) where the capacitor 786 is around 14 pF, resistor R2 is around 20 MΩ and the load current is 10 µA. Under these conditions, a dominant pole (created by the power FETs) would occur at around 20 Hz (shown in graph 904 at a phase of around 90 degrees) and a non-dominant pole would occur at around 26 Hz for load switch circuit 700 of FIG. 7A but excluding level shift circuit 772 and compensation circuit 774. Because of the locations of these poles, load switch circuit 700 is marginally stable with around zero degree phase margin. To prevent load switch circuit 700 from oscillating, the current supplied to load 752 should be no less than 1 to 2 mA to maintain a stable phase margin and to push the non-dominant pole to around 2.5 kHz.

In some example embodiments, the circuitry of FIG. 7B (namely, level shifter 772 and compensation circuit 774) is connected to the portion of load switch circuit 700 of FIG. 7A at node 970. In some example embodiments, load switch circuit 700 will remain stable with load currents as low as 5 µA if level shifter 772 and compensation circuit 774 are included in load switch 700 or if compensation circuit 310 is connected to the circuitry of FIG. 7A instead of level shifter 772 and compensation circuit 774 (where node 770 of compensation circuit 310 is connected to node 970 of the circuitry of FIG. 7A).

Referring to FIG. 7B, level shifter 772 includes amplifier 777, which has a non-inverting input connected to reference voltage 702, and a inverting input connected to input 718 through resistor R4. The output of amplifier 777 is connected to the gates of transistors 776 and 778. The sources of transistors 776 and 778 are connected to ground; the drain of transistor 776 is connected to the inverting input of amplifier 777; and the drain of transistor 778 is connected to the gate of transistor 782 and to node 970 through resistor R5. The drain of transistor 782 is connected to voltage supply 304 through current source 784 (which, in some example embodiments, is used as a source follower current limiter), and the source of transistor 782 is connected to node 770 and to ground through variable resistor 780 (R3). Variable resistor 780 can be used to tune the voltage at node 770 to account for mismatch between transistor 782 and transistor 720. In some example embodiments, resistors R4 and R5 have the same resistance.

Referring to FIG. 7B, compensation circuit 774 is connected to level shifter 772 at node 770 via capacitor 786. Capacitor 786 is connected to the drain of transistor 794. Resistor R2 is connected between the source and drain of transistor 794, and the gate of transistor 794 is connected to node 768 (loop active output of Schmitt trigger 766). Resistor R2 is connected to the gates of transistors 792 and 796 (which form a current mirror). The sources of transistors 792 (M1) and 796 (M2) are connected to ground through resistors RD1 and RD2, respectively. The drain of transistor 796 is connected to the source of transistor 798 and to voltage source 304 via current source 703 (having a current of $I_{BIAS}/2$). The gate of transistor 798 is connected to the gate of transistor 790 (transistor 798 forms a cascode device to transistor 796 and transistor 790 forms the bias for cascode transistor 798), and the drain of transistor 798 is connected to the source of transistor 799. The gate of transistor 799 is connected to the "EN" control signal, and the drain of transistor 799 is connected to node 970 and to voltage source 797 (VCP) through current source 701 (having a current of $I_{BIAS}/2$). The drain of transistor 790 is connected to the gate of transistor 790 and to voltage supply 304 via current supply 791 (having a current of $I_{BIAS}$).

Level shifter 772 facilitates the use of a low-voltage capacitor for capacitor 786 as opposed to a low-density, high-voltage capacitor (such as the capacitor used in compensation circuit 310). This may be advantageous because, depending on the process technology, a high-voltage capacitor may have a density that is lower (possibly, much lower) than a low-voltage capacitor. The compensator 774 operates similarly to compensator 310, except that transistor 794 (also referred to as cascode 794) has been added; current source $I_{BIAS}$ 306 has been split into current supplies 701 and 703 to reduce the current through the charge pump VCP 797; and transistor 794 has been added to transiently disable the compensator 774 when the circuit is recovering from a reverse current condition.

In some example embodiments, transistor 782 is implemented with an LDMOSFET; transistors 790 and 798 are implemented with a native MOSFET or a low-voltage cascode MOSFET; transistors 792 and 796 are implemented with low-voltage nMOSFETs; and transistor 799 is implemented with a high-voltage MOSFET. In another example embodiment, capacitor 786 (C2) is around 14 pF and resistor R2 is around 20 MΩ.

Figure 10:
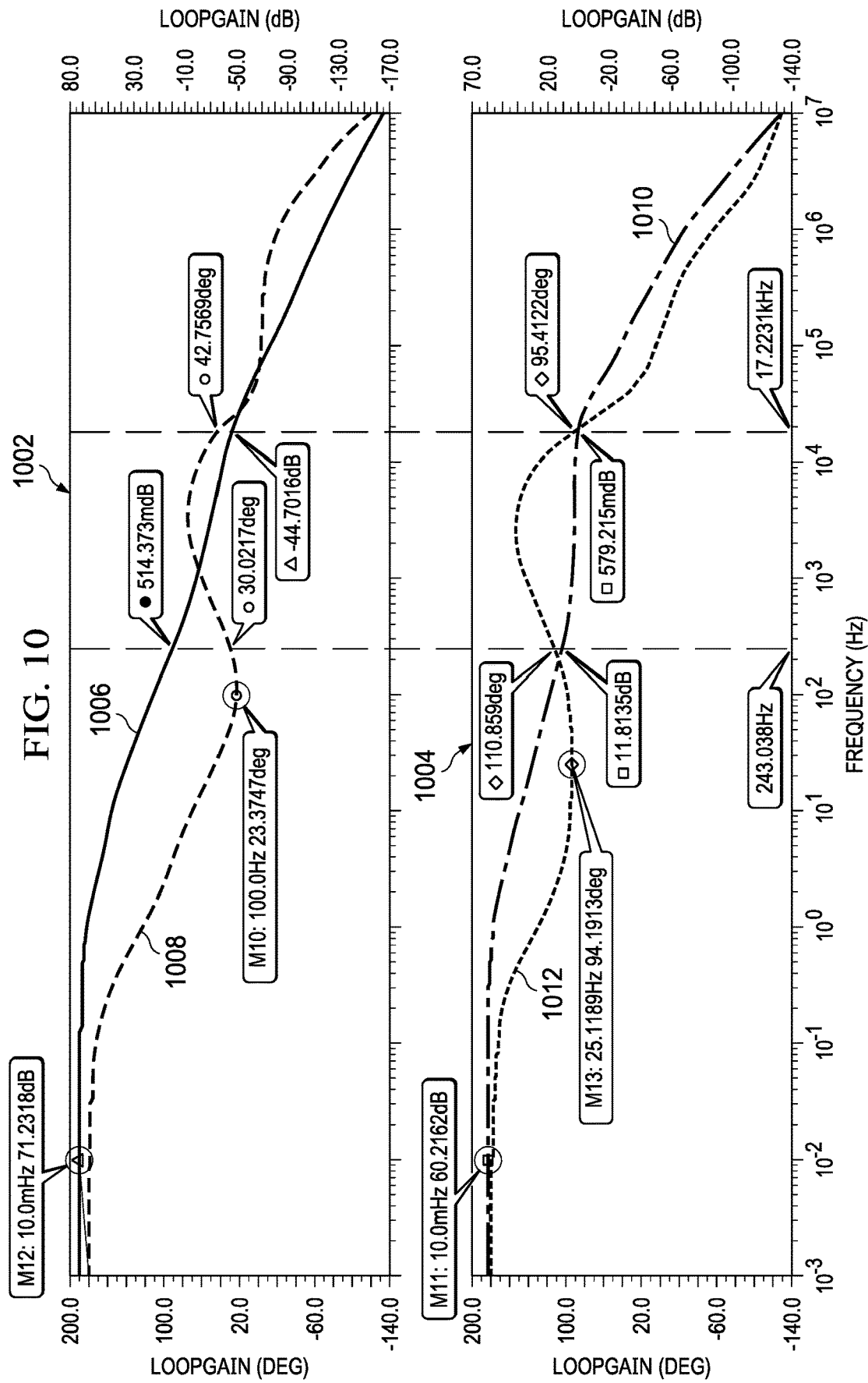
FIG. 10 are bode plots illustrating example embodiments of FIGS. 7A and 7B.

Referring to FIG. 10, plots 1002 illustrate the gain/attenuation (graph 1006 in dB) and loop phase (graph 1008 in degrees) for load switch circuit 700 of FIGS. 7A and 7B where the load current is 1 µA. Plots 1004 illustrate the gain/attenuation (graph 1010 in dB) and loop phase (graph 1012 in degrees) for load switch circuit 700 of FIGS. 7A and 7B where the load current is 8 mA. In the example embodiment where capacitor 786 is around 14 pF, resistor R2 is around 20 MΩ and the load current is 1 µA, the dominant pole of load switch circuit 700 is moved (due to the inclusion of compensation circuit 774) from around 20 Hz to around 500 mHz (shown in graph 1008 where the phase is around 135 degrees) and a zero is added around 500 Hz (shown in graph 1008 where the phase is around 45 degrees). The non-dominant pole at 26 Hz is still present. In the example embodiment where capacitor 786 is around 14 pF, resistor R2 is around 20 MΩ and the load current is 8 mA, the dominant pole of load switch circuit 700 is moved (due to the inclusion of compensation circuit 774) from around 20 Hz to around 500 mHz (shown in graph 1012), a zero is added around 500 Hz (shown in graph 1012) and the non-dominant pole moved from 26 Hz to around 17 kHz.

In some example embodiments, level shifter 772 causes the plate (bottom plate) of capacitor 786 nearest to level shifter 772 to be biased below the plate (top plate) of capacitor 786 nearest to the gate of transistor 796. This biasing will reduce the risk of de-rating capacitor 786 and shifting of the compensation poles and zeros. In this example embodiment, level shifter 772 copies the voltage across resistor R4 and applies it across resistor R5. This causes a shifting of the voltage at the gate of transistor 782 by a value equal to voltage supply 718 ($V_{IN}$) minus reference voltage 702 ($V_{REF}$). In some example embodiments, transistor 782 is smaller than transistor 720 but the two transistors are matched. As load 752 increases, the voltage at the bottom plate of capacitor 786 will increase by transistor 782 sub-threshold slope (this may be dependent upon the fabrication process for the transistor and may be around 100 mV/decade). In this example embodiment, the bottom plate of capacitor 786 may change around 400 mV across the load range.

In operation, the reverse current protection circuitry (RCP Circuitry—comprised of OTA 730, transistor 740, transistor 720, capacitor 750, current source 760, resistor 742 and resistor 728) of load switch 700 will regulate to a set-point, ΔV (which is equal to $V_{IN}$ minus $V_{OUT}$), approximately equal to the RCP set-point. In some example embodiments, the loop active signal is high and transistor 794 will turn on when ΔV slightly exceeds the RCP set-point by a particular voltage (e.g. around 10 mV). When transistor 794 turns off, compensation circuit 774 stabilizes load switch 700. In some example embodiments, transistor 794 remains off when ΔV has exceeded the RCP set-point by a particular voltage (e.g. around 10 mV). When transistor 794 is on, compensation circuit 774 appears to be a capacitive load with a capacitive value of capacitor 786, and the gate of transistor 720 may charge at a fast rate (which may limit the voltage droop at node 724 when the system load 752 suddenly increases).

In some example embodiments, allowing a large bias current in compensation circuit 774 causes the current mirror to be biased to achieve higher transconductance and greater pole/zero separation. However, larger bias current through transistor 796 may cause slower slew rate response with respect to RCP response, because the dynamic range of compensation circuit 774 is related to the bias current when sinking current. In some example embodiments, current source 791 would limit current to be around the bias current, $I_{BIAS}$, while current sources 701 and 703 would each limit current to be around $I_{BIAS}/2$ (shown in FIG. 7B).

Figure 8:
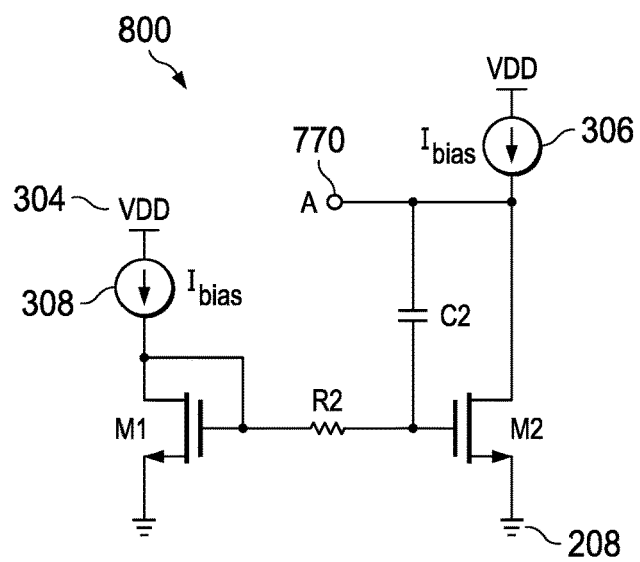
FIG. 8 is a schematic diagram illustrating an alternative compensation circuit of an example embodiment.

Referring to FIG. 8, compensation circuit 800 includes transistors M1 and M2, capacitor C2, resistor R2 and current sources/limiters 306 and 308. As discussed above, transistors M1 and M2 form a current mirror with their sources connected to ground 208, their gates connected via resistor R2 and the gate and source connected for M1. In operation, the capacitance of compensation circuit 800 at node 770 is greater than the capacitance of C2 and the capacitance of transistors M1 and M2. In some example embodiments, compensation circuit 800 may be used to move poles (and add a zero) to a circuit connected to compensation circuit 800 at node 770. In other example embodiments, a circuit (requiring a large capacitance that requires less area and readily implemented on a semiconductor die) may be connected to compensation circuit 800 at node 770 to take advantage of the larger capacitance/small area of compensation circuit 800. As discussed above, compensation circuits 310, 501, 774 and 800 illustrate variants of the compensation circuit of some example embodiments and these variants may be used interchangeably.

In the foregoing discussion and in the claims, the terms "including" and "comprising" are used in an open-ended fashion, and thus should be interpreted to mean "including, but not limited to . . . " An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrases "ground" or similar in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "approximately" preceding a value means+/−10 percent of the stated value. As used herein, the term "modulate" shall also mean "to vary" or "to change." The terms "node", "terminal", "pin" and "interconnection", for example, are interchangeably used and referred to any connection (or interconnection) between features. These terms are not meant to be limiting with respect to a certain type of physical structure. For example, the "terminals" of a circuit element are meant to be each connection to such circuit element. Hence, an integrated resistor would be referred to have two terminals (ends) even though these "terminals" are just the two connections to the integrated resistor.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A compensation circuit comprising:
   a source having an output;
   a first transistor having a first current terminal, a second current terminal, and a first control terminal connected to the first current terminal;
   a second transistor having a second control terminal, a third current terminal, and a fourth current terminal;
   a first resistor having a first end connected to the first control terminal and a second end connected to the second control terminal; and
   a capacitor having a first terminal and a second terminal, the first terminal of the capacitor directly coupled to the second control terminal, and the second terminal of the capacitor connected to an input of the compensation circuit;
   a third transistor having a third control terminal, a fifth current terminal connected to the third control terminal and the output of the source and a sixth current terminal coupled to the first current terminal;
   a fourth transistor having a fourth control terminal directly coupled to the third control terminal, a seventh current terminal, and an eighth current terminal connected to third current terminal; and
   a fifth transistor coupled across the first resistor wherein the fifth transistor is configured to disable the compensation circuit in response to a reverse current condition.

2. The compensation circuit of claim 1, further comprising:
   a second resistor connected between the second current terminal and ground; and
   a third resistor connected between the fourth current terminal and ground.

3. The compensation circuit of claim 1, wherein the source is a first source, the compensation circuit further comprising a second source coupled to the third current terminal and a third source coupled to the seventh current terminal.

4. The compensation circuit of claim 1, wherein each of the first transistor and the second transistor is an n-type MOSFET.

5. The compensation circuit of claim 1, wherein each of the first, second, third and fourth transistors is an n-type MOSFET.

6. A regulator having an input and an output, the regulator comprising:
   a first transistor having a first control terminal, a first current terminal configured to receive a band gap voltage and a second current terminal;
   a second transistor having a second control terminal coupled to the second current terminal, a third current terminal coupled to the input of the regulator and a fourth current terminal coupled to the output of the regulator;
a soft start circuit including:
  a capacitor having a first terminal coupled to the first control terminal and a second terminal coupled to ground; and
  a switch coupled between the first terminal of the capacitor and a first source; and
a compensation circuit including:
  a voltage source;
  a third transistor having a fifth current terminal coupled to the voltage source, a sixth current terminal coupled to the first terminal of the capacitor and a third control terminal;
  a fourth transistor having a fourth control terminal, a seventh current terminal coupled to the voltage source and an eighth current terminal connected to the fourth control terminal;
  a first resistor connected between the third control terminal and the fourth control terminal;
  a capacitor connected between the third control terminal and the sixth current terminal;
  a first current source connected between the sixth current terminal and ground; and
  a second current source connected between the eighth current terminal and ground.

7. The regulator of claim 6, wherein a pole of the regulator is shifted from a first frequency to a second frequency by the presence of the compensation circuit.

8. The regulator of claim 6, wherein the second current terminal of the first transistor is connected to the second control terminal of the second transistor via an operational amplifier.

\* \* \* \* \*